(12) United States Patent
Tanaka et al.

(10) Patent No.: US 7,274,837 B2
(45) Date of Patent: Sep. 25, 2007

(54) OPTICAL TRANSMITTER

(75) Inventors: Tomokazu Tanaka, Atsugi (JP); Tadashi Hatano, Yokohama (JP); Hiroo Matsue, Yokohama (JP); Cleitus Antony, Yokohama (JP)

(73) Assignee: Opnext Japan, Inc., Yokohama-Shi (JP)

( * ) Notice: Subject to any disclaimer, the term of this patent is extended or adjusted under 35 U.S.C. 154(b) by 30 days.

(21) Appl. No.: 11/022,793

(22) Filed: Dec. 28, 2004

(65) Prior Publication Data

US 2005/0175312 A1  Aug. 11, 2005

(30) Foreign Application Priority Data

Feb. 10, 2004  (JP) .............................. 2004-032976

(51) Int. Cl.
*G02B 6/12* (2006.01)

(52) U.S. Cl. ......................... 385/14; 385/129; 385/147

(58) Field of Classification Search ................. 385/147
See application file for complete search history.

(56) References Cited

U.S. PATENT DOCUMENTS 4,920,406 A * 4/1990 Watanabe et al. ........... 257/664

2004/0227678 A1 * 11/2004 Sievenpiper ................ 343/702

FOREIGN PATENT DOCUMENTS

JP  2001-144366  5/2001

* cited by examiner

*Primary Examiner*—Jennifer Doan
(74) *Attorney, Agent, or Firm*—Antonelli, Terry, Stout & Kraus, LLP

(57) ABSTRACT

An optical transmitter in which a microstripline is formed by a signal wiring pattern and a GND conductor pattern on a circuit board (including a flexible board), and a signal lead of a light emitting element module is mounted in a signal lead mounting hole connected with said signal wiring pattern so as to be connected with said signal wiring pattern, wherein a pattern adapted to add capacitance between a stem of said light emitting element module and said signal wiring pattern is provided on said signal wiring pattern on said circuit board, and wherein the pattern adapted to add capacitance has a size corresponding to ±50% of a capacitance $C \approx L/Z_o^2$, where $Z_o$ is signal line impedance, and L is the signal lead inductance.

9 Claims, 7 Drawing Sheets

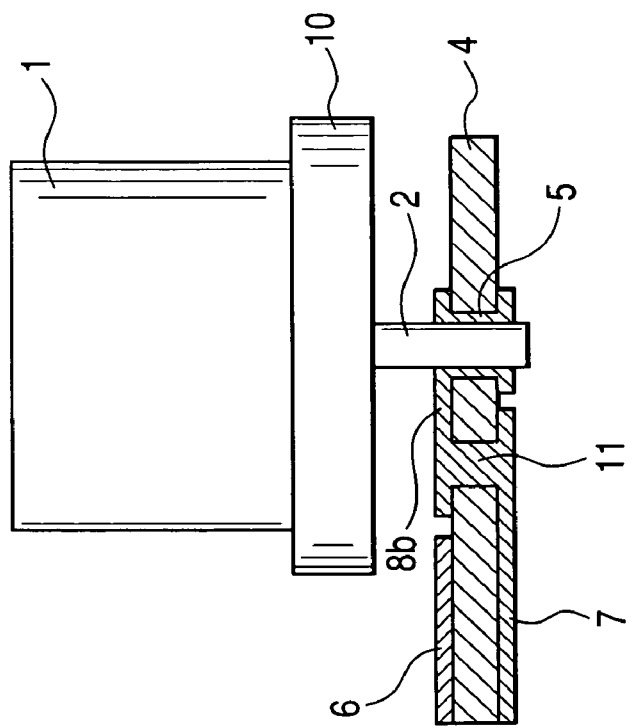
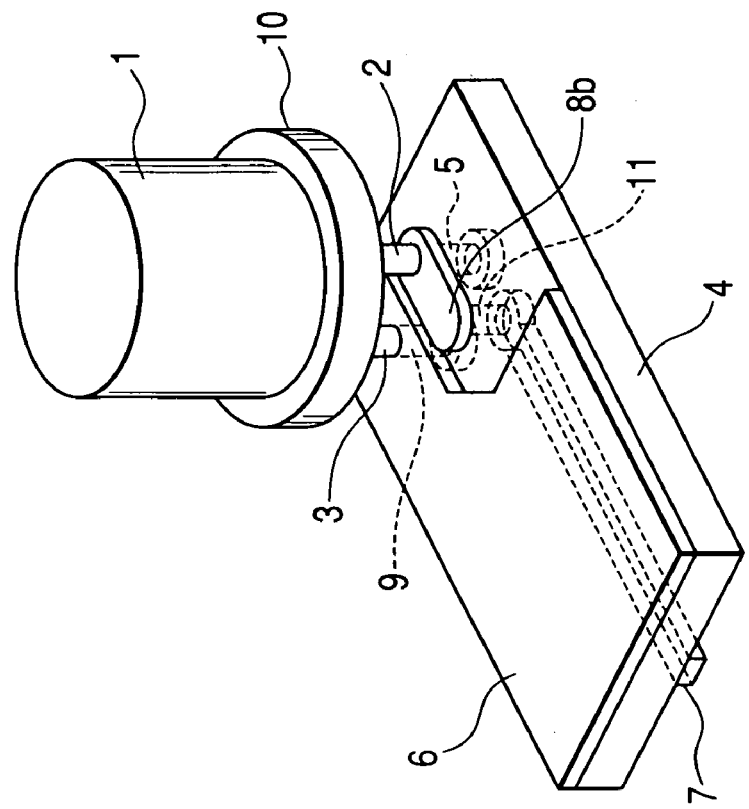
FIG. 2A
FIG. 2B

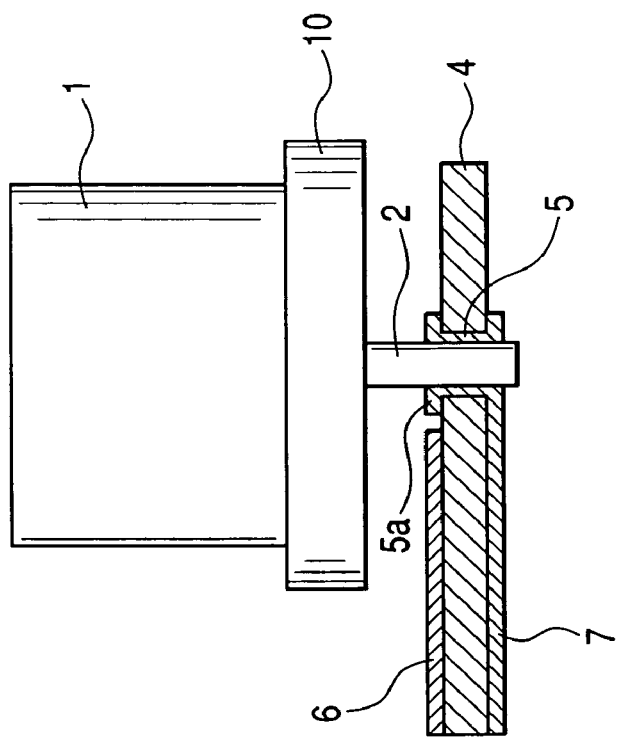
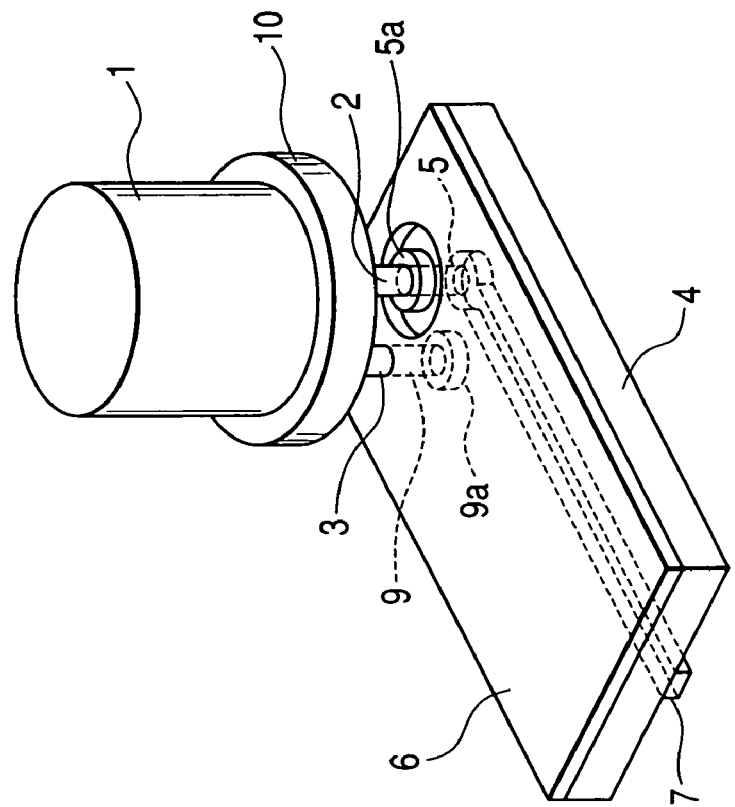
FIG. 8A
FIG. 8B

OPTICAL TRANSMITTER

BACKGROUND OF THE INVENTION

The present invention relates to an optical transmitter, and more particularly to a mounting technique of a light emitting element module.

In mounting a light-emitting element on the optical transmitter, generally, the light-emitting element (or a light-emitting element and its peripheral circuits) is sealed into an air-tightly sealed light-emitting element module, and the light-emitting module is connected with a circuit board of the optical transmitter.

The conventional drive circuit as described has been known in Japanese Patent Laid-open No. 2001-144366, which describes an LD drive circuit. In the LD drive circuit, an LD-stem is mounted adhesively on the side of a grounded conductor formed on the back of a flexible board, and a lead is passed through the flexible board and connected with a wiring pattern on the surface thereof. In addition, a glass-sealed portion of the LD-stem has a cylindrical structure similar to a coaxial line, and a grounded conductor portion corresponding to the glass-sealed portion is removed in advance.

SUMMARY OF THE INVENTION

One example of the technique relating to the mounting method of the light-emitting element module is shown in FIGS. 8A and 8B. FIG. 9 shows an equivalent circuit. FIG. 10 shows the technique in more concrete way. Incidentally, a light-emitting element module 1 having at least a light-emitting element air-tightly sealed has an input signal lead 2 and a GND lead 3. A circuit board 4 of the optical transmitter has a GND conductor pattern 6 on the surface of one side, and a signal-wiring pattern 7 on the surface of the other side, which form a microstripline. The input signal lead 2 of the light-emitting element module 1 is inserted into and soldered to a signal lead mounting hole 5 of the circuit board 4, and the signal lead 2 is connected with the signal-wiring pattern 7. The signal lead mounting hole 5 is a through-hole conductor hole formed with a land 5a on the upper surface thereof. The GND lead 3 is inserted into and soldered to a GND lead mounting hole 9 of the circuit board 4, and the GND lead 3 is connected with the GND conductor pattern 6. The GND lead mounting hole 9 is a through-hole conductor hole formed with a land 9a on the lower surface thereof.

However, the signal lead 2 and the GND lead 3 have a large inductance at high frequency. FIG. 9 shows an equivalent circuit of the connected portion between the light-emitting element module 1 and the circuit board 4. The inductance of the lead portions 2 and 3 causes the high frequency characteristics of a high frequency signal to deteriorate when the light-emitting element module is driven by the high frequency signal. This produces distortion in an input signal to the light-emitting element module to bring about the deterioration of an output light waveform of the light-emitting element module 1.

It is an object of the present invention to provide an optical transmitter that improves an output optical waveform by relieving distortion occurring in an input signal when a light-emitting element module is driven by a high frequency signal with approximately 8 to 10 GHz or more.

To achieve the above-described object, the present invention provides an optical transmitter in which a microstripline is formed by a signal wiring pattern and a GND conductor pattern on a circuit board (including a flexible board), and a signal lead of a light emitting element module is mounted in a signal lead mounting hole connected with the signal wiring pattern so as to be connected with the signal wiring pattern, wherein a capacitance additive pattern connected with the signal wiring pattern is provided on the light emitting element module side on the circuit board whereby capacitance is added between a stem of the light emitting element module and the signal wiring pattern.

Further, in the present invention, the optical transmitter includes a line that is formed using the additive capacitance between the signal wiring pattern on the circuit board and the stem of the light emitting element module.

Further, in the present invention, the optical transmitter includes a dielectric that is inserted between the light emitting element module and the circuit board.

Moreover, in the present invention, the capacitance additive pattern has a size corresponding to ±50% of a capacitance $C \approx L/Z_o^2$, where $Z_o$ is signal line impedance, and $L$ is the signal lead inductance.

According to the present invention, an optical transmitter can be realized wherein in driving a light emitting element module with a high frequency signal in excess of approximately 8 to 10 GHz, an influence of a lead inductance is reduced by a simple and inexpensive construction to thereby lower distortion produced in an input signal, thus improving an output light waveform.

BRIEF DESCRIPTION OF THE DRAWINGS

FIGS. 2A and 2B illustrate an optical transmitter according to a second embodiment of the present invention, FIG. 2A being a perspective view, and FIG. 2B being a front cross-sectional view;

FIGS. 8A and 8B are views showing an optical transmitter as a comparative example;

DESCRIPTION OF THE PREFERRED EMBODIMENTS

Referring now to FIGS. 1 to 7, preferred embodiments of an optical transmitter in accordance with the present invention will be described. The optical transmitter is basically configured such that a light emitting element module having a light emitting element (or a light emitting element and its peripheral circuits) sealed into a metal stem with glass or the like is connected with a circuit board (including a flexible board) formed with a microstripline including a GND conductor pattern and a signal wiring pattern.

Embodiment 1

Figure 1B:
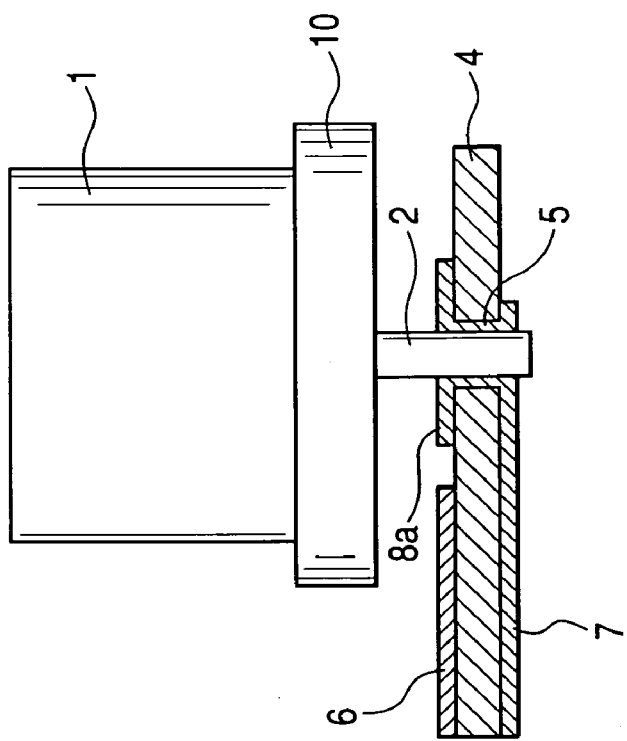
FIGS. 1A and 1B illustrate an optical transmitter according to a first embodiment of the present invention, FIG. 1A being a perspective view, and FIG. 2B being a front cross-sectional view.
Figure 1A:
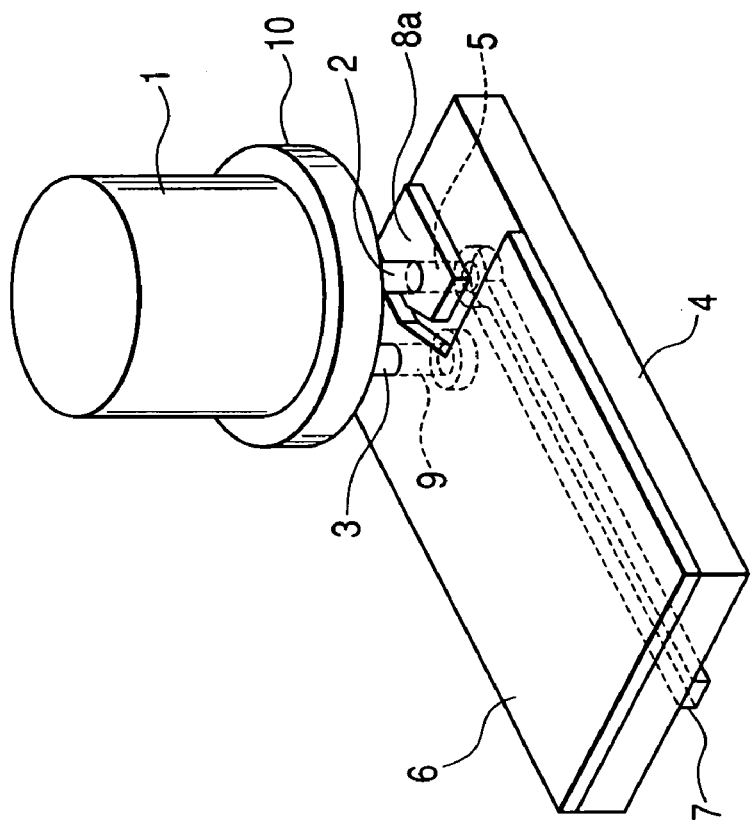

FIGS. 1A and 1B illustrate an optical transmitter according to a first embodiment of the present invention, FIG. 1A being a perspective view, and FIG. 1B being a front cross-sectional view.

In the first embodiment, a microstripline is formed by a GND conductor pattern 6 formed on the light-emitting element module side (surface side) on a circuit board 4 and a signal wiring pattern 7 formed on the opposite side (back side) of the light emitting element module with an insulator disposed therebetween. A high frequency signal is transmitted to the circuit board 4.

A light-emitting element module 1 includes a light-emitting element (or a light-emitting element and its peripheral circuits) air-tightly sealed up in a metal stem 10 with glass or the like. The metal stem 10 has a cylindrical structure similar to a coaxial line by a glass-sealed portion. In addition, the glass-sealed portion in the metal stem 10 is provided a signal lead 2 coaxially therewith and a GND lead 3 at a position eccentric therewith. The metal stem 10 is electrically connected to the GND lead 3.

Further, the GND lead 3 is inserted into a GND lead mounting hole (GND lead insert hole) 9 that is formed at a position corresponding to an appropriate portion of the GND conductor pattern 6 formed on the surface side of the circuit board 4 and connected (joined) thereto with solder or the like. Thus, the metal stem 10 of the light emitting element module 1 is electrically connected to the GND conductor pattern 6 through the GND lead 3. Accordingly, the metal stem 10 will be GND connected with the GND conductor pattern 6 through the GND lead 3.

On the other hand, the signal lead 2 bonded with glass or the like to the light emitting element module 1 is inserted into a signal lead mounting hole (signal insert hole) 5 formed at a position corresponding to an appropriate portion of the signal wiring pattern 7 formed on the back surface of the circuit board 4 and connected (joined) thereto with solder or the like. Thus, the signal lead 2 is electrically connected with the signal wiring pattern 7.

Further, a capacitance additive pattern 8a connected to the signal lead 2 is provided on the side of the light emitting element module 1. The capacitance additive pattern 8a faces the metal stem 10 and has its area much greater than that of a land for forming a through-hole conductor hole. Thus, the metal stem 10 and the capacitance additive pattern 8a are combined in capacity to thereby add the capacitance between the signal pattern 7 and the GND of the light emitting element module 1. The capacitance additive pattern 8a need be coupled to the signal lead 2 in such a manner as to be spaced from the GND conductor pattern 6 connected with the GND lead 3. Thus, the capacitance additive pattern 8a has a false rectangular shape spread (extended) in a side direction opposite to the GND lead 3 and in a direction perpendicular to the GND lead 3 from the signal lead 2, as shown in FIG. 1A.

The capacitance additive pattern 8a has the size corresponding to ±50% of its capacitance $C \approx L/Zo^2$, where Zo is signal line impedance, and L is the signal lead inductance.

Figure 5:
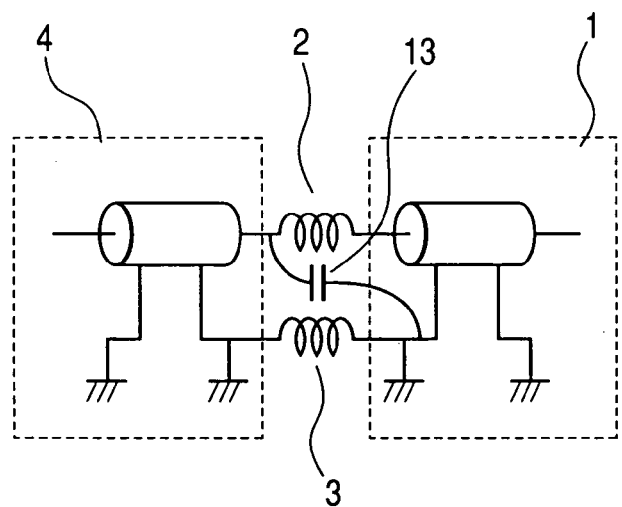
FIG. 5 is a diagram showing an equivalent circuit of the first embodiment.

An equivalent circuit view using the present structure is shown in FIG. 5. By using the capacitance additive pattern 8a, an additive capacitance 13 is to be added. By the provision of the additive capacitor 13, it is possible to relieve the influence of inductance of the signal lead 2 and the GND lead 3.

Embodiment 2

FIGS. 2A and 2B are views showing a second embodiment of an optical transmitter according to the present invention, FIG. 2A being a perspective view thereof, and FIG. 2B being a sectional view of a front portion thereof.

The second embodiment is different from the first embodiment in the following. The signal wiring pattern 7 on the circuit board 4 is connected with the capacitance additive pattern 8b on the side of the light emitting element module 1 via a through-hole 11 located in front of the signal lead 2. A microstripline is formed between the capacitance additive pattern 8b and the metal stem 10 while the capacitance between the signal wiring pattern 7 and the metal stem 10 is added by the capacitance additive pattern 8b. That is, in the second embodiment, the microstripline is formed using the capacitance additive pattern 8b for adding capacitance between the signal wiring pattern 7 and the metal stem 10 of the light emitting element module 1.

Note that as with the first embodiment the capacitance additive pattern 8b need be connected to the signal lead 2 in such a manner as to be spaced from the GND conductor pattern 6 connected with the GND lead 3. Thus, the capacitance additive pattern 8b is a false rectangular line extending in the direction perpendicular to the GND lead 3 from the signal lead 2, as shown in FIG. 2A.

Further, the capacitance additive pattern 8a has the size corresponding to ±50% of its capacitance $C \approx L/Zo^2$, where Zo is signal line impedance, and L is the signal lead inductance.

With the present structure described above, it is possible to keep the non-continuity of the line small as compared with the first embodiment.

Embodiment 3

Figure 3:
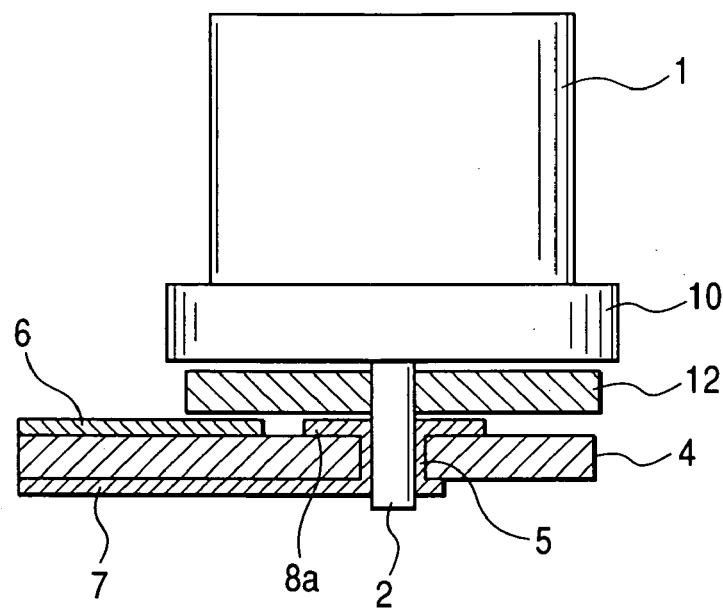
FIG. 3 is a front cross-sectional view of an optical transmitter according to a third embodiment of the present invention.

FIG. 3 is a cross-sectional front view of an optical transmitter according to a third embodiment the present invention.

The third embodiment has the following structure, in addition to the structure of the first embodiment. A spacer 12 as a dielectric (insulating sheet) for keeping a gap constant is inserted between the light emitting element module 1 and the circuit board 4 in order to keep the capacitance value of an additive capacitor 13 constant. With this structure, it is possible to obtain stable high-frequency characteristics while reducing the influence of inductance of the lead portion.

Embodiment 4

Figure 4:
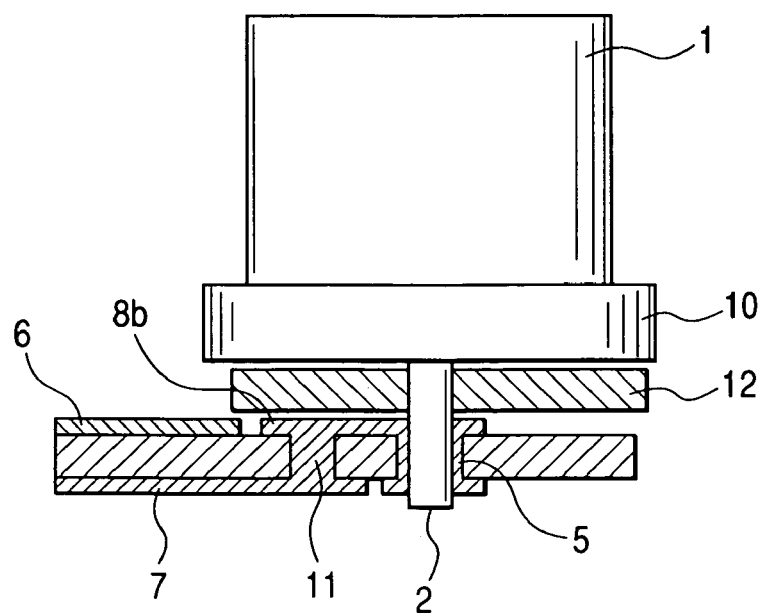
FIG. 4 is a front cross-sectional view of an optical transmitter according to a fourth embodiment of the present invention.

FIG. 4 is a cross-sectional front view of an optical transmitter according to a fourth embodiment of the present invention.

The present embodiment has the following structure, in addition to the structure of the second embodiment. A spacer 12 comprising a dielectric (insulating sheet) for maintaining a gap constant is inserted between the light emitting element module 1 and the circuit board 4 in order to maintain a line impedance of a microstripline formed by the capacitance pattern 8*b* constant. With the present structure, it is possible to obtain stable high-frequency characteristics while reducing the influence of inductance of a lead portion.

Note that in the first to fourth embodiments described above, the circuit board 4 may be a rigid board or flexible board.

Figure 6:
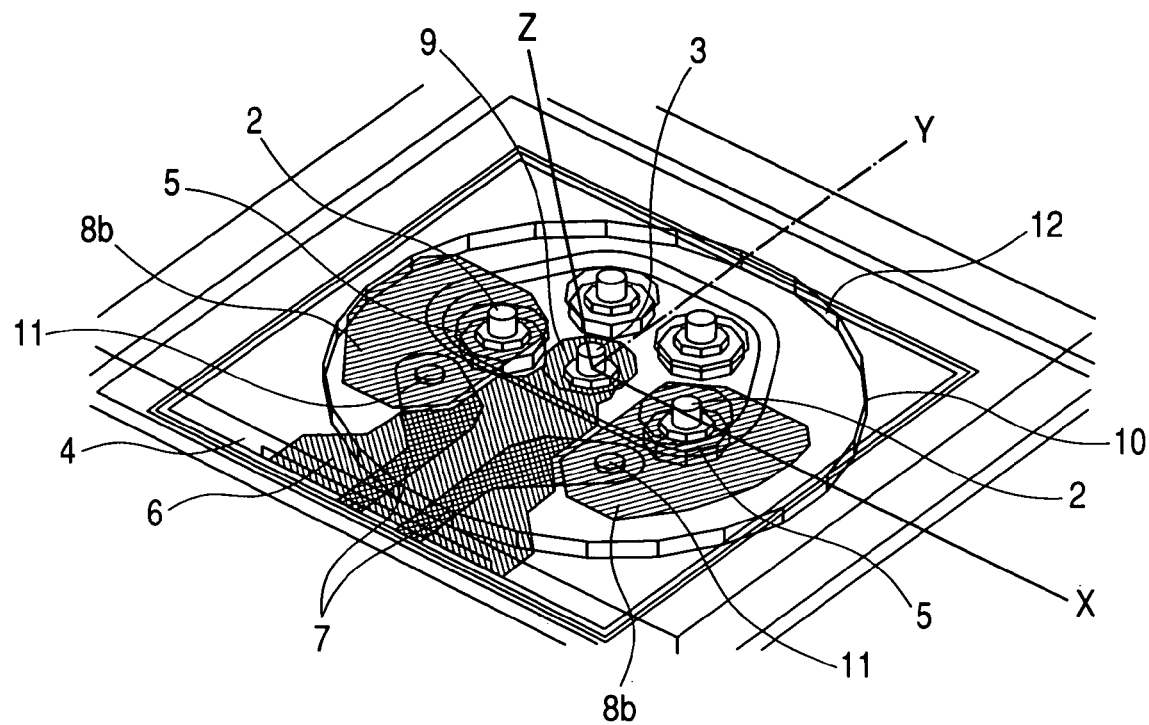
FIG. 6 is a perspective view, in the fourth embodiment, showing the lead structure having two signal leads and one GND lead.
Figure 7:
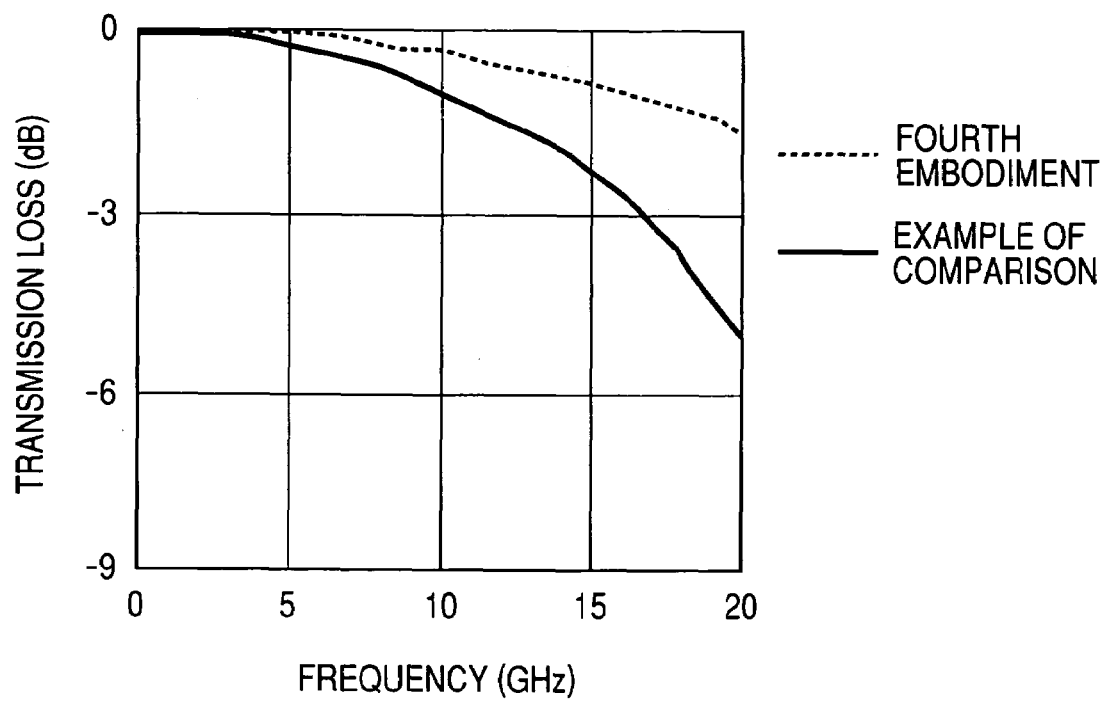
FIG. 7 is a graph showing a signal transmission loss (dB) with respect to a frequency (GHz) obtained by analyzing respective electromagnetic fields in the fourth embodiment (FIG. 6) and a comparative example (FIG. 10)
Figure 9:
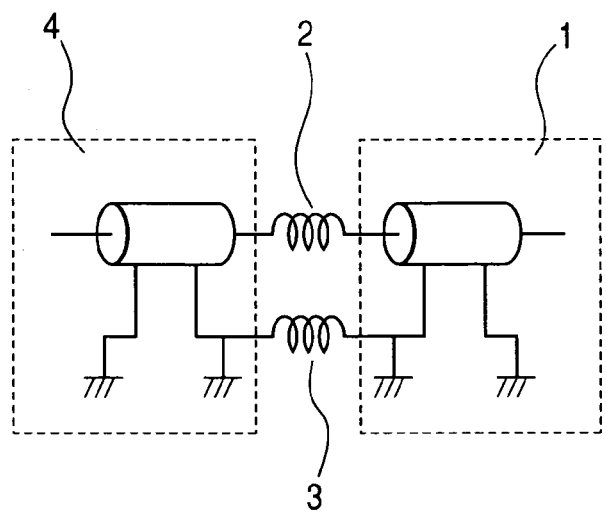
FIG. 9 is a diagram showing the equivalent circuit of the comparative example shown in FIG. 8.
Figure 10:
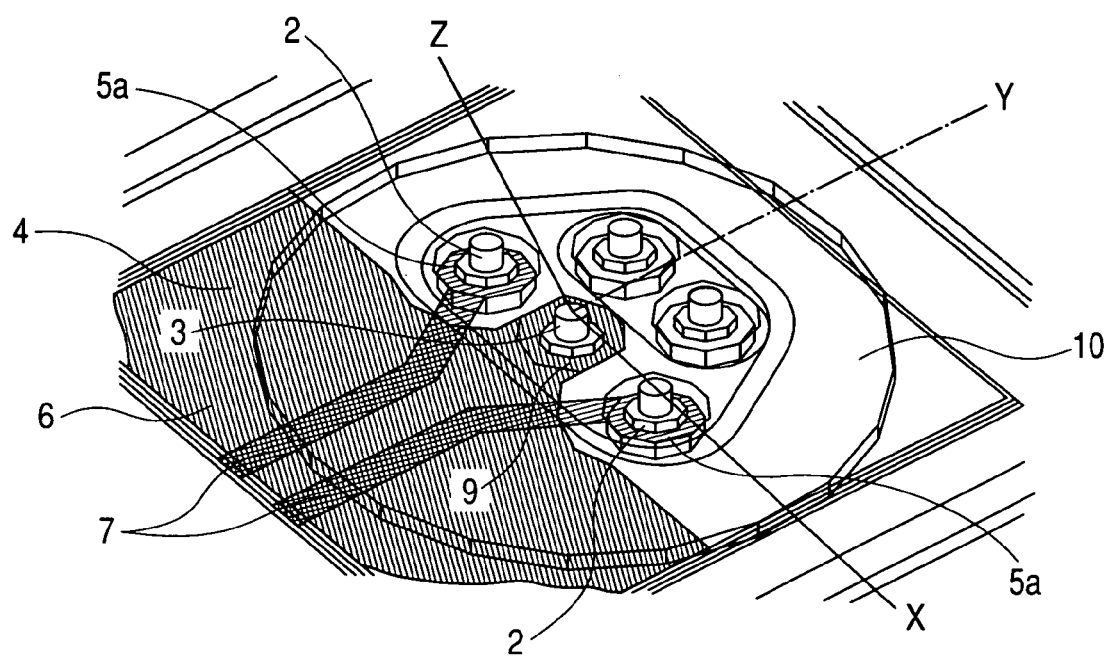
FIG. 10 is a perspective view, in the comparative example shown in FIG. 8, showing the lead structure having two signal leads and one GND lead.

To confirm the effect of the present invention, the electromagnetic field analysis was carried out using the fourth embodiment (FIG. 6) and the comparative example (FIG. 10). The structures each having two signal leads and one GND lead were adopted, and a signal transmission loss with respect to a differential signal was calculated. As a result, it was confirmed that as shown in FIG. 7, the transmission loss of a signal is 20 GHz, that is, improved by about 3 dB. FIGS. 6 and 10 show the metal stem 10, the signal lead 2, and the GND lead 3 in the light emitting element module 1, and transparently show the spacer 12 comprising an insulator or a dielectric for the circuit board 4.

What is claimed is:

1. An optical transmitter in which a microstripline is formed by a signal wiring pattern and a GND conductor pattern on a circuit board, and a signal lead of a light emitting element module is mounted in a signal lead mounting hole of said circuit board connected with said signal wiring pattern so as to be connected with said signal wiring pattern, wherein a pattern adapted to add capacitance between a stem of said light emitting element module and said signal wiring pattern is provided on said signal wiring pattern on said circuit board, wherein the pattern adapted to add capacitance has a size corresponding to ±50% of a capacitance $C \approx L/Zo^2$, where Zo is signal line impedance, and L is the signal lead inductance;

wherein said GND conductor pattern is formed on a surface of a light emitting element module side of said circuit board and said signal wiring pattern is formed on another surface of said circuit board, wherein said pattern adapted to add capacitance is formed with a substantially rectangular shape around said signal lead on said surface of the light emitting element module side of said circuit board, and wherein said signal wiring pattern and said pattern adapted to add capacitance are electrically connected through another hole of said circuit board different from said signal lead mounting hole.

2. The optical transmitter according to claim 1, wherein a dielectric is inserted between said light emitting element module and said circuit board.

3. The optical transmitter according to claim 1, wherein a dielectric is inserted between said light emitting element module and said circuit board.

4. The optical transmitter according to claim 1, wherein said circuit board includes a flexible circuit board.

5. An optical transmitter in which a microstripline is formed by a signal wiring pattern and a GND conductor pattern on a circuit board, and a signal lead of a light emitting element module is mounted in a signal lead mounting hole of said circuit board connected with said signal wiring pattern so as to be connected with said signal wiring pattern, and in which a GND lead of said light emitting element module is mounted in a GND lead mounting hole connected with said GND conductor pattern so as to be connected with said GND conductor pattern, wherein a pattern adapted to add capacitance between a stem of said light emitting element module and said signal wiring pattern is provided on said signal wiring pattern on said circuit board, wherein the pattern adapted to add capacitance has a size corresponding to ±50% of a capacitance $C \approx L/Zo_2$, where Zo is signal line impedance, and L is the signal lead inductance, wherein said GND conductor pattern is formed on a surface of a light emitting element module side of said circuit board and said signal wiring pattern is formed on another surface of said circuit board, wherein said pattern adapted to add capacitance is formed with a substantially rectangular shape around said signal lead on said surface of the light emitting element module side of said circuit board, and wherein said signal wiring pattern and said pattern adapted to add capacitance are electrically connected through another hole of said circuit board different from said signal lead mounting hole.

6. The optical transmitter according to claim 5, wherein said circuit board includes a flexible circuit board.

7. An optical transmitter in which a microstripline is formed by a signal wiring pattern and a GND conductor pattern on a circuit board, and a signal lead of a light emitting element module is mounted in a signal lead mounting hole of said circuit board connected with said signal wiring pattern so as to be connected with said signal wiring pattern, wherein a line is formed using an additive capacitor between said signal wiring pattern on said circuit board and a stem of the light emitting element module, wherein said additive capacitor is provided by the pattern adapted to add capacitance provided on said signal wiring pattern, wherein the pattern adapted to add capacitance has a size corresponding to ±50% of a capacitance $C \approx L/Zo_2$, where Zo is signal line impedance, and L is the signal lead inductance;

wherein said GND conductor pattern is formed on a surface of a light emitting element module side of said circuit board and said signal wiring pattern is formed on another surface of said circuit board, wherein said pattern adapted to add capacitance is formed with a substantially rectangular shape around said signal lead on said surface of the light emitting element module side of said circuit board, and wherein said signal wiring pattern and said pattern adapted to add capacitance are electrically connected through another hole of said circuit board different from said signal lead mounting hole.

8. The optical transmitter according to claim 7, wherein a dielectric is inserted between said light emitting element module and said circuit board.

9. The optical transmitter according to claim 7, wherein said circuit board includes a flexible circuit board.

* * * * *